Feb. 3, 1970

O. E. WAGNER 3,493,913

THERMALLY SENSITIVE MATERIAL OF THE SEMICONDUCTOR OR DIELECTRIC TYPE

Filed Oct. 17, 1968

4 Sheets-Sheet 1

INVENTOR.
ORVIN E. WAGNER
BY Paul E. Hodges
Attorney

Feb. 3, 1970

O. E. WAGNER 3,493,913

THERMALLY SENSITIVE MATERIAL OF THE SEMICONDUCTOR OR DIELECTRIC TYPE

Filed Oct. 17, 1968

4 Sheets-Sheet 2

INVENTOR
ORVIN E. WAGNER

BY Paul E. Holzer
Attorney

INVENTOR
ORVIN E. WAGNER
BY Paul E. Hodges
Attorney

INVENTOR
ORVIN E. WAGNER

BY Paul E. Hodges
Attorney

United States Patent Office 3,493,913
Patented Feb. 3, 1970

3,493,913
THERMALLY SENSITIVE MATERIAL OF THE SEMICONDUCTOR OR DIELECTRIC TYPE

Orvin E. Wagner, Knoxville, Tenn.
(1051 Farrell Road, Arroya Grande, Calif. 93420)

Continuation-in-part of application Ser. No. 610,303, Jan. 19, 1967. This application Oct. 17, 1968, Ser. No. 768,490
Int. Cl. H01c *7/04;* H01b *3/00, 1/06*
U.S. Cl. 338—22 9 Claims

ABSTRACT OF THE DISCLOSURE

A thermally sensitive material comprising a solvated particulate salt disposed in the pores of a matrix. This material may be utilized as a semiconductor, as in a thermistor, or it may be utilized as a dielectric, as in a capacitor.

BACKGROUND OF THE INVENTION

This application is a continuation-in-part of Ser. No. 610,303, filed January 19, 1967, which is now abandoned.

This invention relates to thermally sensitive materials of the semiconductor or dielectric type and to thermally sensitive electrical devices fabricated of the subject materials.

As discussed herein, this invention will be referred to as it would be employed in a novel thermistor or capacitor. The usefulness of this invention as a semiconductor or dielectric in other electrical devices will be readily recognized, however.

SUMMARY OF THE INVENTION

The present invention contemplates a thermally sensitive material comprising a particulate solvated salt in its solid state disposed in the pores of a matrix. In certain applications the matrix pores are interconnected in substantially all directions such as will provide pathways for hole and/or electron travel between pores and in other applications, it is desired that the matrix pores be closed, as will be more fully discussed hereinafter. For purposes of this invention, a "solvated" particulate salt is a salt having a sufficient quantity of solvent associated therewith such that each particulate is substantially jacketed with at least a monomolecular layer of solvent.

Preferably, one or a small number of salt molecules comprise each salt particulate. This particulate is solvated at least to the extent of a monomolecular layer of solvent jacketing the solid particulate. The solvated particulate resides in, and substantially fills, a pore of the matrix. To the extent practicable, each pore is so filled. Consequently, between the salt and matrix there is developed a solvent boundary.

Within each pore, a portion of the salt particulate is taken into solution by the solvent. This dissolved salt ionizes. The cations and anions form dipoles. Upon application of heat, more salt ionizes and, simultaneously, holes and electrons commence breaking away thereby becoming free to travel. These holes and/or electrons travel, via surface conduction apparently, from pore to pore. The quantity of holes or electrons so breaking away is a function of the thermal increase experienced by the device. The net result is a change in the electrical conductivity of the device. It is recognized, of course, that whether electrical conduction is by holes or electrons depends upon the relative mobilities of the holes and electrons.

If one plots the log of the dielectric constant of a specimen of the present material versus the reciprocal of the absolute temperature, in general the slope of the resultant line is proportional to the dissociation energy of the salt molecule. The slope of a similar plot for the resistance is generally proportional to the dissociation energy plus the ionization energy of the radical which becomes the cation or plus the electron affinity of the radical becoming the anion depending on whether holes or electrons are the predominate carriers. A combination of both electrons and holes are generally present but usually one type of carrier predominates. The predominance of a specific carrier depends on the ionization energy and the mobility involved for the specific carrier. ("Dissociation energy" as used herein means ionic dissociation energy.)

In a capacitor or like device, upon application of an electric field across a specimen of the present material, the existing dipoles align themselves readily with the applied field. The net result is ready polarization of the material. This characteristic of the material renders it useful in fabricating a thermally sensitive capacitor.

DESCRIPTION OF THE INVENTION

Figure 1:
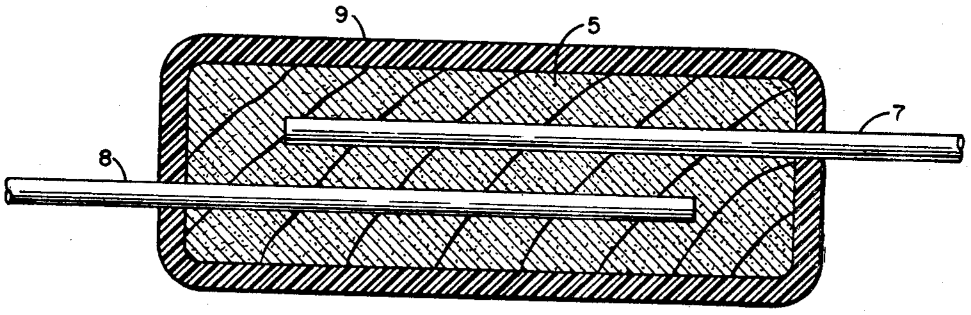
FIGURE 1 is a schematic representation, in section, of one embodiment of a thermistor device according to the present invention.

Referring now to FIG. 1, one embodiment of a thermister constructed in accordance with the present invention comprises a porous matrix 5, whose pores are substantially filled with solvated salt particulates, a pair of electrical leads 7 and 8 in electrical contact with the matrix, and, preferably, some form of encapsulation 9 surrounding the matrix.

Figure 2:
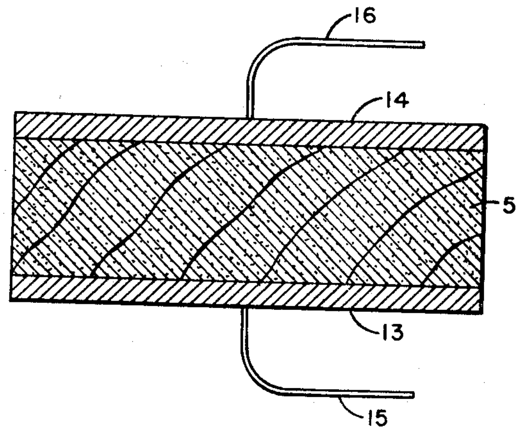
FIGURE 2 is a schematic representation, in section, of one embodiment of a capacitor device according to the present invention.

FIG. 2 depicts a capacitor comprising a quantity of porous matrix 5 disposed between parallel metal plates 13 and 14 each having an electrical lead 15 and 16 attached thereto. The matrix pores are substantially filled with solvated salt particulates as in FIG. 1. It will be recognized that in capacitor applications, it may be desired that the matrix pores be closed so as to increase the resistance of the material without deleteriously affecting the polarizability of the material.

Figure 3:
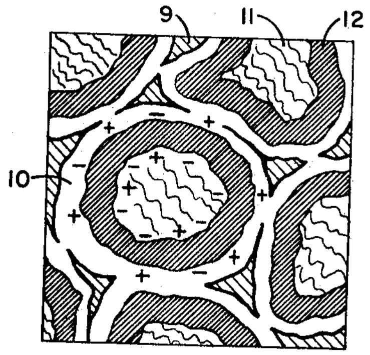
FIGURE 3 is a schematic representation, in enlarged section, of typical interconnecting matrix pores containing solvent-jacketed salt particulates and depicting several dipoles.
Figure 4:
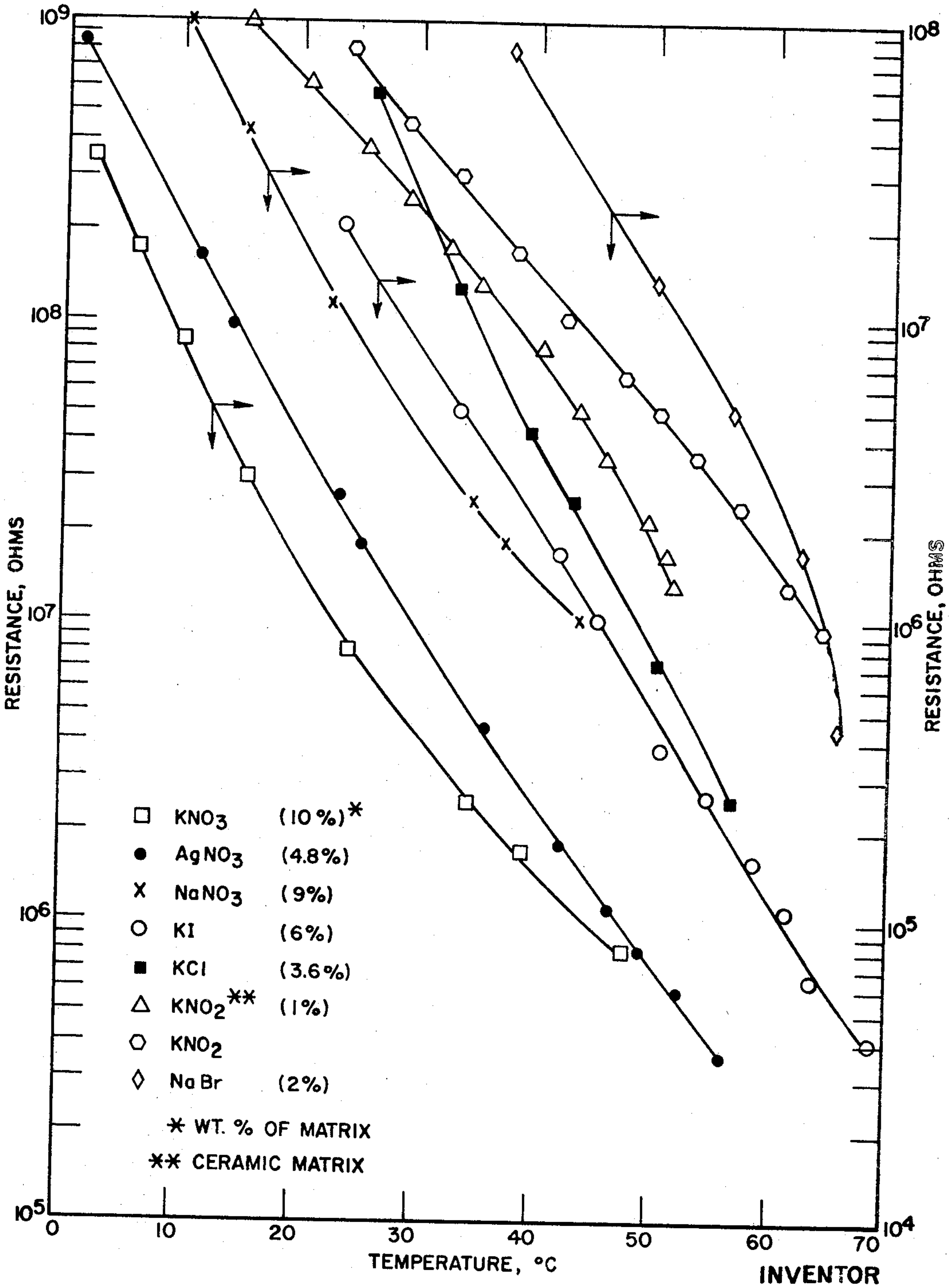
FIGURES 4 through 7 are graphs depicting the resistance change of selected thermally sensitive devices fabricated in accordance with the principles of the present invention and employing wood matrices except where otherwise noted in the figures.
Figure 5:
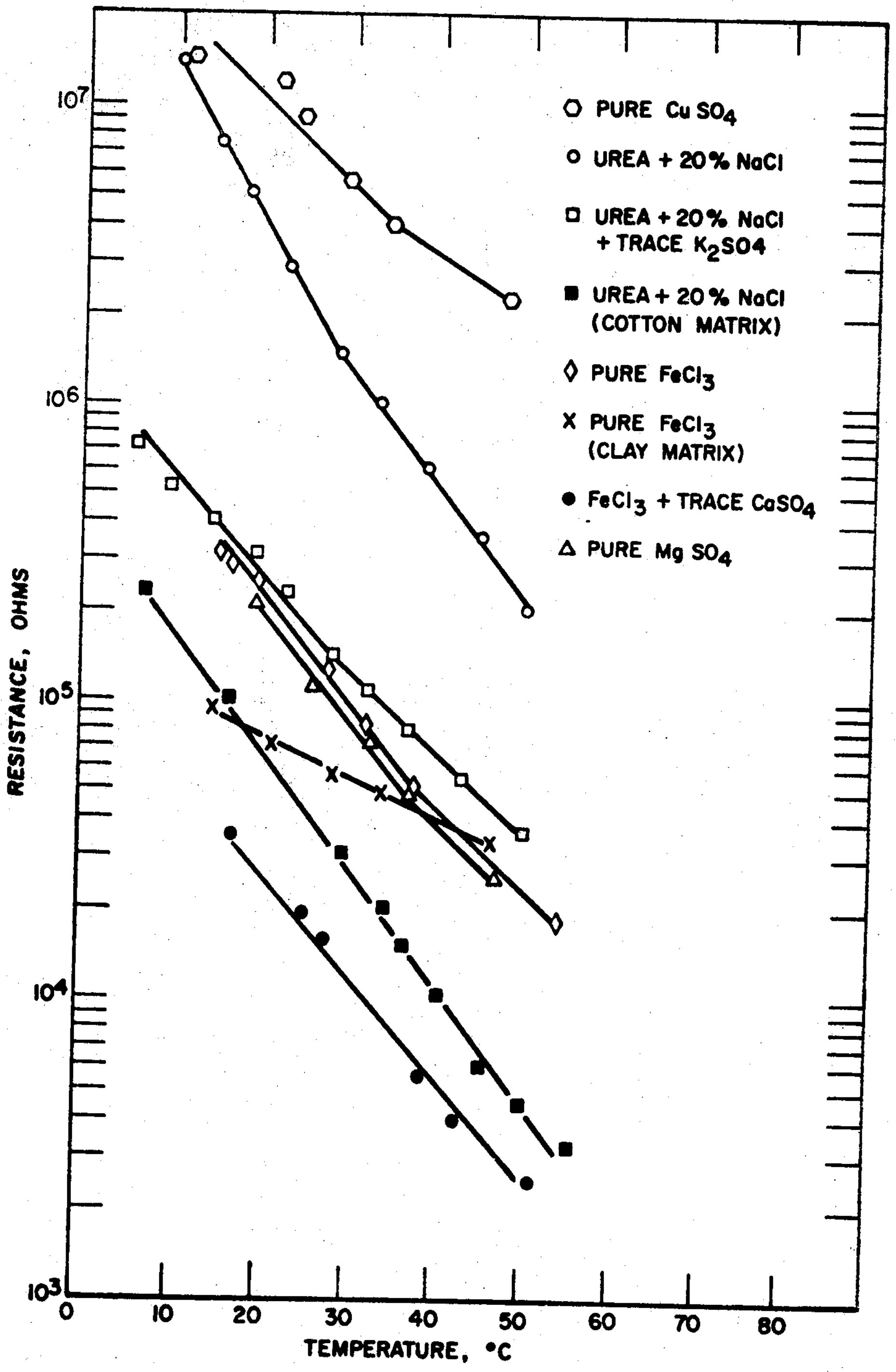
Figure 6:
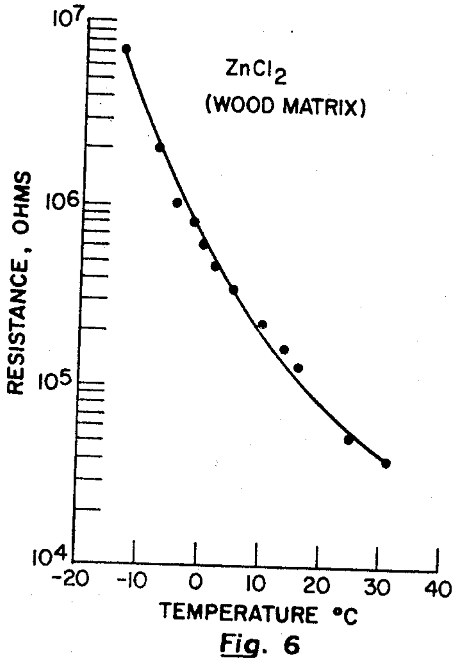
Figure 7:
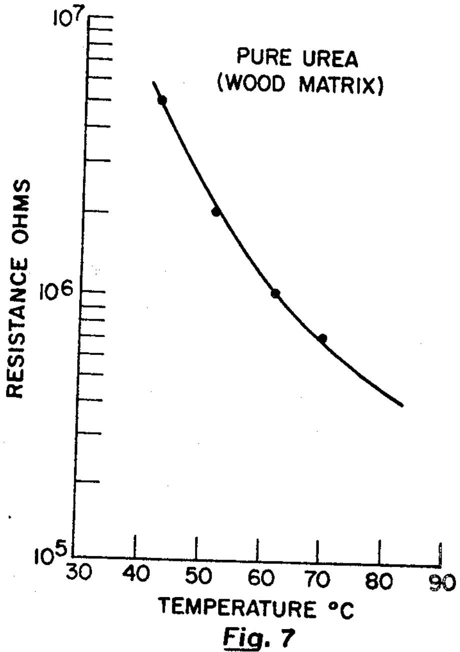
Figure 8:
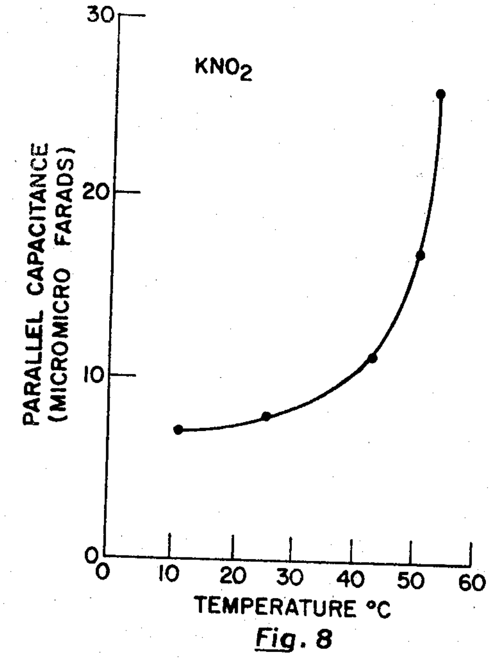
FIGURES 8 and 9 are graphs depicting the capacitance change of selected thermally sensitive devices fabricated in accordance with the principles of the present invention and employing wood matrices.
Figure 9:
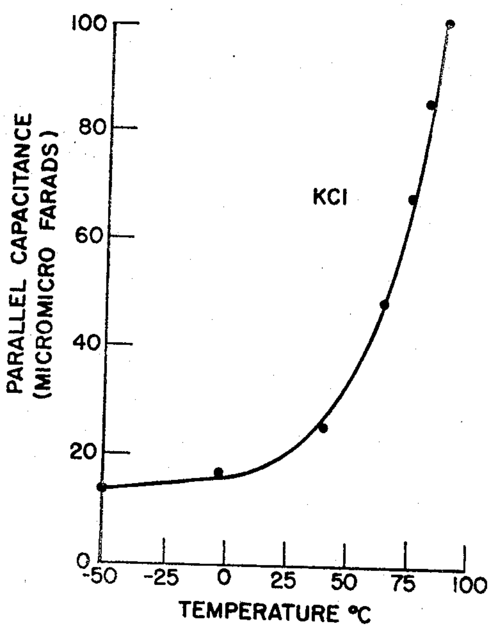

The relationship of the salt, its solvent, and the matrix is depicted in FIG. 3. As nearly as practicable, each pore 10 of the matrix 9, is substantially filled by a solvated salt particulate 11, each particulate being jacketed by at least a monomolecular layer of solvent 12.

The thermally sensitive material contemplated by the inventor may be fabricated by any of several acceptable methods, each of which may vary according to the chosen matrix material, salt, and/or solvent.

Great freedom is available in choosing a matrix. Wood, ceramics, clays, organic matter, etc. have been found to be acceptable. In thermistor or like, applications where maximum conductivity (without decreasing sensitivity) is desired, it is necessary that the matrix possess open pores which interconnect in at least one direction. As stated hereinbefore the electrical conductivity of the present devices comprises hole and/or electron transport between pores. Accordingly, open, interconnecting pores in the matrix are essential in certain applications of the material. Pore size is preferably in the angstrom range. Uniformity of pore size is desirable. Pine wool and porous aluminum oxide are typical acceptable matrix materials. In certain fabrication processes, open porosity of the matrix may be required to permit the introduction of solvated salt particulates into the pores. Of course, one can fabricate an acceptable device by powder metallurgy techniques involving admixing matrix particles and solvated salt particulates and subsequently pelletizing the same. For this type of fabrication process one may freeze the solvent as a coating on the salt particle prior to the mixing step. Thus, metallurgy techniques can be employed to produce "closed pore" material.

The end use of the device dictates its size and configuration. For example, a thin disc may be desirable if the material is to be utilized in a capacitor, whereas an elongated rod-type configuration, a bead, or even a disc may be chosen for a thermistor. It will be recognized that the magnitude of the electrical parameters assignable to a specimen of the present material (e.g. resistance) will be dependent upon the size and configuration of the device.

Acceptable solvated salts include $FeCl_3$, NaCl, Urea, $KNO_3$, KI, NaBr, KCl, $NaNO_3$, $AgNO_3$, $KNO_2$, $MgSO_4$, and/or mixtures of these. Addition of a less soluble salt to one of the above can be utilized to adjust the resistivity values of the material, for example $FeCl_3$ plus a trace of $CaSO_4$.

The choice of solvent can vary widely. Water, kerosene, and methyl or ethyl alcohol, are typical acceptable solvents. The relatively small-molecule polar solvents, such as water, are preferred. For capacitors, ethanol is a preferred solvent, giving smaller loss factors than certain other solvents. The choice of salt will also affect one's choice of solvent, all in accordance with well known principles of chemistry relating ot solubilities, compatibilities, etc.

In preparing solvated salts, the inventor prepares at least a saturated, and preferably a supersaturated, solution of the salt and solvent. Subsequent treatment, as discussed hereinafter, dictates the quantity of solvent retained in the pores in association with the salt particulate. The usual water of hydration frequently found in salts appears inconsequential as concerns the quantity of solvent to be associated with a salt particulate.

In a typical operation for fabricating the subject material, the inventor selects a ¼" x ¼" x 1" piece of pine wood to serve as hte matrix material. The pores in a wood matrix may range from about 100 to about 1000 angstroms in diameter. This matrix is heat treated, by boiling for example, to remove the tars, resins, etc. therefrom. The wood matrix is next dried and weighed, then held in a solution of solvated salt, with boiling, for a time sufficient to ensure homogeneous dispersion of the salt solution throughout the matrix. This step in the operation fills substantially all pores with salt solution. Alternatively, alternate applications of vacuum and pressure can be used in forcing the salt solution into the pores. The salt solution-filled matrix is next dried slowly at 20° C. to 120° C. to gradually drive solvent from the pores. Periodically during this drying process, the salt solution-containing matrix is weighed. During the solvent removal process, the salt remains in the pores. Solvent removal is stopped at that point where the combined weight of salt and solvent equals a preselected percentage of the matrix weight.

When embodying the present material in a capacitor device, depending upon the desired performance of the capacitor, it may be desired that the relative quantity of solvent, with respect to the quantity of salt, in each pore be maximized. In fabricating the material for use in such a capacitor (that is, in maximizing the solvent content), it is necessary only that one retain a reservoir of solid salt such that as the temperature of the material (capacitor) is increased, additional salt is available for disassociation and formtaion of dipoles. In any type device, it is essential that this reservoir of salt be present over the operating temperature range intended for the material. Without such reservoir of salt, the material loses its thermal sensitivity.

The temperature of a given device (thermistor, capacitor, etc.) is one condition which affects the instantaneous electrical parameters of the device. The present inventor has found that a device utilizing material of the type hereinbefore described is extraordinarily sensitive to temperature changes as respects the electrical parameters (resistance or capacitance) of the device. These relationships are depicted in FIGS. 4 to 9. The slope at any given point on each curve on the graphs in the figures represents the sensitivity of the device, at that point, to temperature change—the greater the slope, the greater the sensitivity. Table 1 shows the relationship of the weight percent solvent (relative to the matrix weight) to the actual resistance parameters at 23° C. of typical specimens of the present material as embodied in thermistor devices. This table also shows that regardless of the anticipated temperature range over which the material is designed to function, useful stable resistance parameters are obtainable only where, at 23° C., the salt-solvent weights equal about ½% to about 20% of the matrix weight. Without regard to the actual resistance or capacitance value of a given device, so long as the device is constructed in accordance with the principles taught herein, the device will respond to thermal change in the approximate manner and degree indicated in FIGS. 4 to 9.

It is noted that the theory of operability of the present material is based upon present knowledge and interpretation of experimental data. The inventor, of course, does not intend to be restricted to the theory expounded herein; rather, the invention is to be restricted only by the claims as follows.

TABLE 1.—WOOD MATRIX [1]

| Wt. of solvent (percent of matrix wt.) | Resistance at 23° C. (ohms) | | | | |
|---|---|---|---|---|---|
| | $KNO_2$ [2] | $KNO_3$ | $AgNO_3$ | KI | $NaNO_3$ |
| 0 | ∞ | ∞ | ∞ | ∞ | ∞ |
| ½ | $7.5\times10^7$ | $3.2\times10^9$ | $5.5\times10^9$ | $5.5\times10^9$ | $2\times10^{11}$ |
| 1 | $4\times10^7$ | $2.2\times10^9$ | $3.4\times10^9$ | $3.3\times10^9$ | $1.4\times10^1$ |
| 4 | $1\times10^6$ | | $4\times10^7$ | $1.2\times10^8$ | $4.8\times10^9$ |
| 7 | | $1.7\times10^8$ | | | |
| 10 | Unstable | $1\times10^7$ | $1.4\times10^5$ | $1.5\times10^5$ | $1.0\times10^7$ |
| 15 | | $5\times10^4$ | Unstable | Unstable | Unstable |
| 20 | | Unstable | | | |

[1] ¼" x ¼" x 1".
[2] Ceramic matrix.

I claim:

1. A thermally sensitive material for use in electrical devices comprising a relatively electrically non-conductive porous matrix which is essentially chemically inert with respect to other constituents of said material.

a quantity of at least one solid ionizable substance disposed in at least a major portion of the pores of said matrix, and a quantity of liquid solvent intimately associated with said ionizable substance in said pores, wherein the weight of said solvent is between about 0.1 and 20 percent of the matrix weight and when disposed within said matrix said solvent is capable of ionizing at least a part but less than all of said ionizable substance.

2. The invention of claim 1 wherein the combined weight of said substance and solvent is between ½ and 20 percent of the matrix weight.

3. The invention of claim 1 wherein the matrix is a wood.

4. The invention of claim 1 wherein the solvent is selected from the group consisting of water, kerosene, ethanol and methanol.

5. The invention of claim 1 wherein the ionizable particulates are solid-inorganic salt particulates.

6. A thermally sensitive resistor comprising
- a relatively electrically non-conductive porous matrix which is essentially chemically inert with respect to other constituents of said resistor and having a multiplicity of interconnecting pores therein,
- ionizable particulates in their solid state disposed in at least a majority of said pores,
- a quantity of liquid solvent intimately associated with said ionizable particulates, wherein the weight of said solvent is between about 0.1 and 20 percent of the matrix weight and when disposed within said matrix said solvent is capable of ionizing at least a part but less than all of said ionizable particulates, and,
- at least two electrical leads electrically communicating with said matrix.

7. The thermally sensitive resistor of claim 6 wherein said ionizable particulates are salt particulates.

8. The thermally sensitive resistor of claim 6 wherein said ionizable particulates comprise a mixture of at least two salts.

9. A thermally sensitive capacitor comprising
- at least two spaced apart electrical conductors,

- a relatively electrically non-conductive porous mixture which is chemically inert with respect to other constituents of said capacitor disposed in the space between said conductors,
- ionizable particulates in their solid state disposed in at least a majority of said pores, and,
- a quantity of liquid solvent intimately associated with said ionizable particulates, wherein the weight of said solvent is between about 0.1 and 20 percent of the matrix weight and when disposed with said matrix said solvent is capable of ionizing at least a part but less than all of said ionizable particulates.

References Cited

UNITED STATES PATENTS

| | | | |
|---|---|---|---|
| 3,093,883 | 6/1963 | Haring et al. | 317—258 X |
| 3,184,660 | 5/1965 | Robinson | 317—258 |
| 3,225,320 | 12/1965 | Solomons | 317—518 X |
| 3,236,705 | 2/1966 | Gilman et al. | 252—500 X |

REUBEN EPSTEIN, Primary Examiner

U.S. Cl. X.R.

252—63, 63.2, 518; 317—247, 258